United States Patent
Shishiguchi et al.

[11] Patent Number: 5,972,785
[45] Date of Patent: Oct. 26, 1999

[54] METHOD FOR MANUFACTURING A SEMICONDUCTOR DEVICE HAVING A REFRACTORY METAL SILICIDE LAYER

[75] Inventors: Seiichi Shishiguchi; Hiroshi Kitajima, both of Tokyo, Japan

[73] Assignee: NEC Corporation, Tokyo, Japan

[21] Appl. No.: 08/954,123

[22] Filed: Oct. 20, 1997

[51] Int. Cl.$^6$ .................... H01L 21/3205; H01L 21/4763
[52] U.S. Cl. ........................... 438/592; 438/683; 438/684
[58] Field of Search ................................... 438/592, 683, 438/684, 682

[56] References Cited

U.S. PATENT DOCUMENTS

| | | |
|---|---|---|
| 4,716,131 | 12/1987 | Okazawa et al. . |
| 5,798,296 | 8/1998 | Fazan et al. . |
| 5,863,820 | 1/1999 | Huang . |
| 5,874,353 | 2/1999 | Lin et al. . |

FOREIGN PATENT DOCUMENTS 2-288236  11/1990  Japan .

*Primary Examiner*—Richard Booth
*Assistant Examiner*—Ron Pompey
*Attorney, Agent, or Firm*—Young & Thompson

[57] ABSTRACT

Disclosed is a method for selectively forming silicon layers on diffusion layers of a MOS transistor so as to form an elevated structure in order to lower a resistance of the source/drain region. The method is aimed to lower the temperature required for the process of forming the elevated structure. In order to accomplish the foregoing object, the method of manufacturing a semiconductor device according to the invention is characterized in that titanium silicide layers are laminated in two steps. First, thin titanium films are grown on the diffusion layers and thereafter an annealing is applied to form titanium silicide layers; and then the titanium films remaining unreacted on the insulating films are removed. Thereafter, another silicon layer is selectively grown on the titanium silicide layers, followed by a new titanium layer. A second annealing step is performed to obtain a second titanium silicide layer laminated on the first titanium suicide layer. The titanium layers and the titanium silicide layers act as gettering films for oxygen from native oxide films formed on the surface.

14 Claims, 3 Drawing Sheets

METHOD FOR MANUFACTURING A SEMICONDUCTOR DEVICE HAVING A REFRACTORY METAL SILICIDE LAYER

BACKGROUND OF THE INVENTION

1. Field of the Invention

The present invention relates to a method of manufacturing a semiconductor device, and particularly to a method of manufacturing an insulated gate field effect transistor having a refractory metal silicide layer.

2. Description of the Related Art

Accompanied with the trend for higher integration of semiconductor devices, the device size has become increasingly fine. However, in the fine patterning of the insulated gate field effect transistor (hereinafter, referred to as MOS transistor), it is generally known that the short channel effect will create a problem. As a method for suppressing the short channel effect, it has been researched to make shallow the depth of the source/drain diffusion layer of the MOS transistor.

However, to simply make shallow the diffusion layer leaves problems such as increase of the sheet resistance and increase of the contact resistance with wiring materials. To overcome these problems, proposals to form elevated structures have been made, i.e., a structure that a silicon layer is selectively grown so as to selectively pile up on the diffusion layer and gate electrode, and a method that forms a metal silicide film on the foregoing piled up structure, as disclosed in the Japanese Patent Application Laid Open No. 2-288236.

As shown in FIG. 3(a), a device isolation oxide film 2 is formed on a surface of an N-type silicon substrate 1 to partition a device forming region. On the surface of the device forming region, a gate electrode 3 is formed, a gate electrode 4 of a silicon is formed, an insulating spacer 6 is formed, $BF_2$ ions are implanted, and an annealing is applied, thus forming P-type diffusion layers 5-1, 5-2. Next, in order to expose a surface of the gate electrode 4 and surfaces of the P-type diffusion layers 5-1, 5-2, the surfaces are treated by a dilute HF. Thereafter, to remove a native oxide film, the silicon substrate is heated in a hydrogen atmosphere inside the growth chamber, or under a high vacuum and more than 800° C., usually about 900° C. And then, silicon layers 7-1, 7-2, 7-3 are grown by the selective CVD, using a silane system gas. Next, as shown in FIG. 3(b), a titanium film 8 is deposited on the whole surface, and an annealing under about 650° C. is applied in an $N_2$ atmosphere to form titanium silicide layers 9-1, 9-2, 9-3 as shown in FIG. 3(c). Next, a titanium film 8a remaining unreacted is removed.

According to the foregoing conventional method, it is possible to lower a resistance of the source/drain region having a shallow diffusion layer. However, to remove the native oxide film requires a high temperature heat treatment, which causes rediffusion of impurities. Therefore, although it is possible to make a diffusion layer as shallow as a diffusion layer of a MOS transistor having the gate length of about 0.5 μm, it is impossible to apply the conventional method to a MOS transistor having a fine structure of deep submicron level.

In order to lower the threshold temperature for the preliminary treatment that enables to remove the native oxide film and to selectively grow the silicon layer, attempts in laboratories have been made, such as a method to use fluorine or hydrogen radical, and a method to irradiate ultraviolet rays in a hydrogen atmosphere; however, these methods are not established yet as a technique for mass production. The foregoing Japanese Patent Application Laid Open No. 2-288236 discloses a method to prevent the formation of the native oxide film in the atmosphere by using a $CHF_3$ being a gas for etching in forming the insulating spacer to deposit a polymer containing a carbon on the surface of the silicon layer. However, the silicon layer is selectively grown at 900° C. in that case, and it is not clear whether or not the method can prevent the formation of the native oxide film to the extent that a high temperature heat treatment becomes needless. Further, the carbon will increase a leakage current across the PN junction between the diffusion layer and the substrate, which is disadvantageous.

All in all, naturally a technique is preferable which lowers a resistance of the source/drain region without specially needing a high temperature heat treatment for removing the native oxide film.

SUMMARY OF THE INVENTION

The present invention has been made in view of the foregoing problems, and an object of the present invention is to provide a method of manufacturing a semiconductor device, excellent in adaptability for mass production, that is able to enhance the characteristic of a MOS transistor having a fine structure of deep submicron level while lowering the temperature in the process of forming a silicon layer or silicide layer to form an elevated diffusion layer.

A first method of manufacturing a semiconductor device according to the present invention is a process of forming a refractory metal silicide film laminated on a diffusion layer selectively formed on a surface of a silicon substrate comprising the process steps of: forming a first silicide layer by depositing a first metal film on a surface of the diffusion layer and applying a first annealing; removing the first metal film remaining unreacted by etching; selectively growing a silicon layer by CVD on the first silicide layer; and forming a second silicide layer by depositing a second metal film to overlay the silicon layer and applying a second annealing.

A second method of manufacturing a semiconductor device according to the present invention comprises the processes of: forming a gate electrode of a silicon on a gate insulating film formed on a silicon substrate and selectively forming a diffusion layer on a surface of the silicon substrate, self-aligned with the gate electrode; exposing a top surface of the gate electrode and a surface of the diffusion layer; forming first silicide layers on each of the top surface of the gate electrode and the exposed surface of the diffusion layer by depositing a first metal film on the whole surface, applying a first annealing, and thereafter removing the first metal film remaining unchanged into a silicide film; selectively growing silicon layers by CVD on the first silicide layers; and laminating second silicide layers on the first silicide layers by depositing a second metal film, applying a second annealing, and thereafter removing the second metal film remaining unchanged into a silicide film.

In the foregoing methods, the first metal film may be a titanium film, and the second metal film may comprise any one of a titanium film, tungsten film, molybdenum film, or cobalt film. Further, a polysilicon layer may selectively be grown by using a $Si_2H_6$ gas as a raw material gas. Further still, a polysilicon layer may selectively be grown by using a $SiH_2Cl_2$ gas and a HCl gas as a raw material gas.

To selectively grow a silicon layer on a surface of a crystalline silicon requires to remove a native oxide film on the surface of the silicon. Since there grows a native oxide film on the surface after the HF treatment, usually a flash annealing treatment of more than 800° C. is applied in a high vacuum to remove a native oxide film. In contrast to this, the method of the invention forms a titanium film after the HF treatment, and thereafter applies an annealing. Here, the native oxide film formed after the HF treatment is gettered by the titanium film or the silicide film thereof and removed. Next, the substrate is treated by a mixed solution of, for example, an aqueous ammonia and aqueous hydrogen peroxide, and thereby the titanium film remaining unreacted on the insulating film is removed. By this process, the titanium silicide layer remains only on the silicon layer. A native oxide film is formed on the surface of this titanium silicide layer; however, in the course of heating the substrate toward the silicon growth temperature, the oxygen under the surface diffuses into the silicide layer to be gettered by the titanium. This mechanism enables to remove the oxygen in the silicide layer by a low temperature. And, the silicide layer having the oxygen removed forms unbonded hands of the silicon on the surface thereof. Therefore, without applying the flash annealing treatment under a high temperature, the silicon layer can be grown selectively on the silicide layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Preferred embodiments of the present invention will hereafter be described in detail with reference to the accompanying drawings.

A first embodiment will be described with reference to FIG. 1(a) through FIG. 1(e).

Figure 1A:
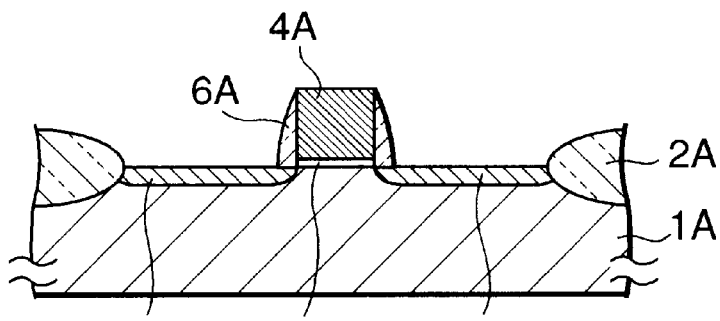
FIGS. 1(A)–1(E) illustrate sectional views for explaining the processes of a first embodiment, being shown in order to be divided into (a) through (e)

As shown in FIG. 1(a), a device isolation oxide film 2A is formed by the LOCOS method on an N-type silicon substrate 1A to partition a device forming region. On the surface of the device forming region, a gate electrode 3A of 8 nm thick is formed by the thermal oxidation method, and thereafter, a polysilicon film of 200 nm thick is formed by the chemical vapor deposition method.

Next, a gate electrode 4A of a silicon is formed, patterning by the photolithography technique.

Next, an oxide silicon film of 50 nm thick is formed by CVD, and then the oxide silicon film is etched back by the anisotropic dry etching to form an insulating spacer 6A. Thereafter, using the ion implantation method, $BF_2$ ions are implanted under the condition of accelerating voltage 10 keV and areal density $3 \times 10^{15}/cm^2$. And then, an annealing is applied under 1000° C. for about 10 seconds in a nitrogen atmosphere to activate the implanted ions; thus forming P-type diffusion layers 5A-1, 5A-2, as shown in FIG. 1(a).

Figure 1B:
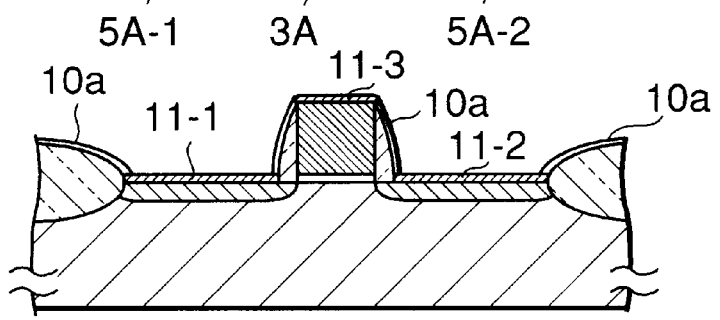

Next, the substrate is treated by the dilute HF to remove the insulating film formed on the surface of the silicon substrate while the P-type diffusion layers are formed. Thereafter, a titanium film of 5 nm is grown by the spattering method. Further, an annealing is applied under 650° C. for about 30 seconds so as to mutually react the silicon with the titanium film in contact therewith, thus forming the titanium film into titanium silicide layers 11-1, 11-2, 11-3 ($TiSi_2$ of crystal form C49) of about 10 nm thick, as shown in FIG. 1(b). The titanium film thickness formed by the spattering in this process is preferably more than about 2 nm so as to sufficiently getter the native oxide film, However, from the view point of the device designing, it is suitable that the whole silicide film thickness in completion is about 30 to 50 nm. From this view point, a thinner silicide film is preferable at this stage, and the thickness is preferably less than about 10 nm.

Figure 1C:
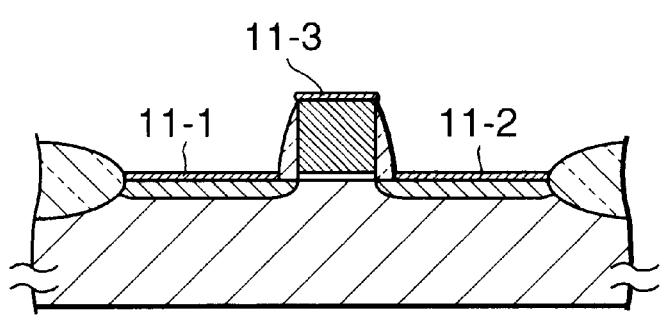

Next, the substrate is treated by a mixed solution of an aqueous ammonia and aqueous hydrogen peroxide, and a titanium film 10a remaining unreacted on the insulating film is removed (FIG. 1(c)).

Figure 1D:
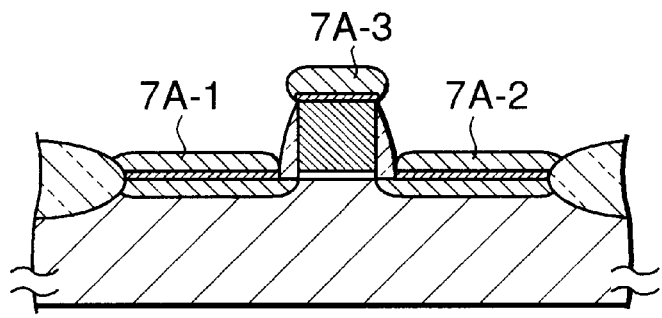

Thereafter, using a UHV-CVD (high vacuum CVD) apparatus, under the condition of the substrate temperature 650° C. and Si2H6 gas partial pressure $1.3 \times 10^{-2}$ Pa, silicon layers 7A-1, 7A-2, 7A-3 of 30 nm each are selectively grown on the titanium silicide layers 11-1, 1 1-2, 11-3, respectively, as shown in FIG. 1(d). The growth time was about three to five minutes, depending on other conditions.

Figure 1E:
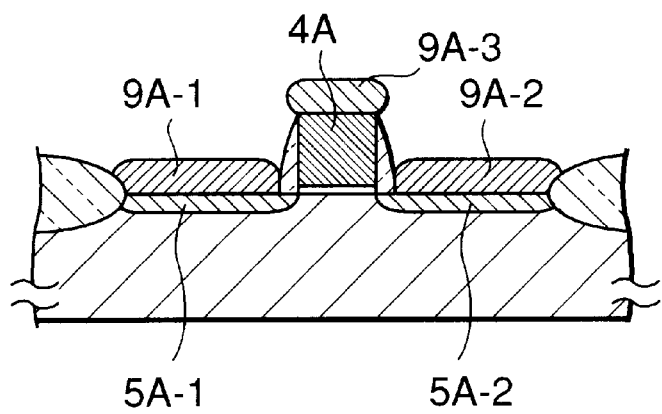

Further, a titanium film of 30 nm thick is grown by the spattering method, and then annealing at 650° C. for about 30 seconds is applied to form the film into a silicide film. Thereafter, the substrate is treated by the mixed solution of an aqueous ammonia and aqueous hydrogen peroxide, and a titanium film remaining unchanged into the silicide film on the insulating film is removed. Thus, as shown in FIG. 1(e), a MOS transistor is formed which has a source/drain region that the titanium silicide layers 9A-1, 9A-2 are laminated on the P-type diffusion layers 5A-1, 5A-2, and a polycide gate electrode that the titanium silicide layer 9A-3 is laminated on the top surface of the gate electrode 4A.

Thereafter, by employing the well-known process, a MOS integrated circuit is manufactured.

Thus, forming a titanium silicide layer on a surface of a silicon substrate will spare a high temperature heat treatment that is done only for removing a native oxide film, and in addition both the temperature for forming the silicide film and the temperature for selectively growing the silicon layer can be lowered to 650° C., which greatly suppresses redistribution of impurities from the diffusion layer for source/drain. In practice, as to the P-type diffusion layer in FIG. 1(a), the impurity profile was compared by SIMS (secondary ion mass spectrometry) before and after the process of forming elevated layers, and the result did not find any redistribution of impurities.

Next, a second embodiment of the invention will be described.

The structure of the semiconductor device is the same as that of the first embodiment, and the processes before growing Si layers to form elevated layers are applied in the same manner as the first embodiment.

Figure 2A:
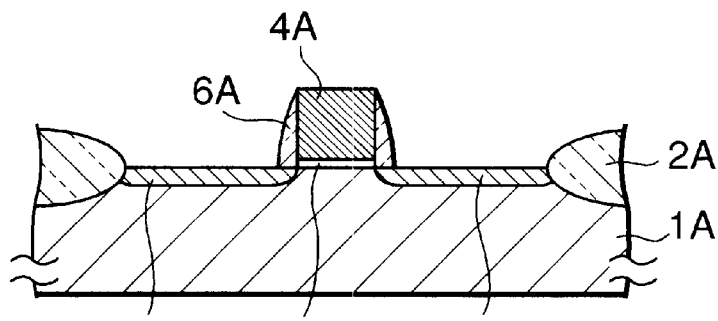
FIGS. 2(A)–2(E) illustrate sectional views for explaining the processes of a second embodiment, being shown in order to be divided into (a) through (e)
Figure 2B:
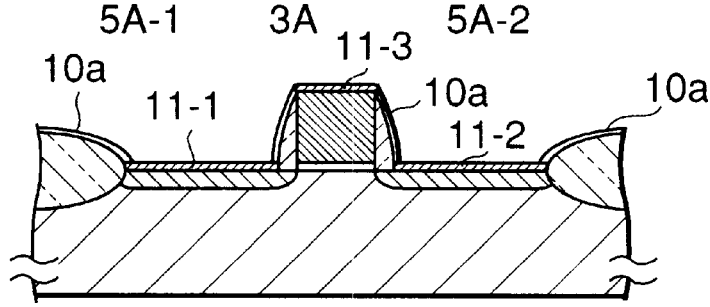
Figure 2C:
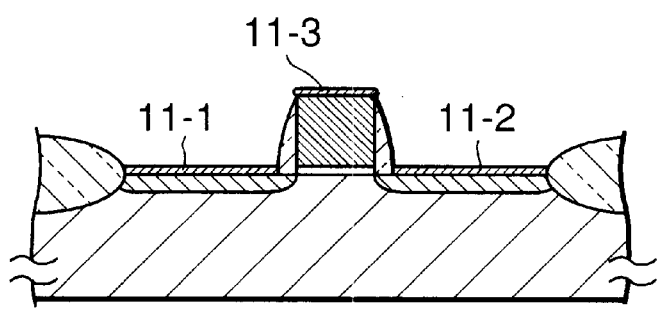

As shown in FIG. 2(a), a device isolation oxide film 2A is formed, thereafter a gate oxide film 3A and a gate electrode 4A of a silicon are formed. Next, insulating spacers 6A are formed on both sides of the gate electrode. Thereafter, using the ion implantation method, $BF_2$ ions are implanted under the condition of accelerating voltage 10 keV and areal density $3\times10^{15}/cm^2$. And then, an annealing is applied under 1000° C. for about 10 seconds in a nitrogen atmosphere to activate the implanted ions; thus forming P-type diffusion layers 5A-1, 5A-2. Thereafter, depositing a titanium film and annealing for forming a silicide film are performed to remove a titanium film 10a remaining unreacted on the insulating film, as shown in FIG. 2(b); and titanium silicide layers 11-1, 11-2, 11-3 are made to remain only on the crystalline silicon, as shown in FIG. 2(c).

Next, silicon layers 7B-1, 7B-2, 7B-3 are selectively grown on the titanium silicide layers 11-1, 11-2, 11-3 that are formed on the P-type diffusion layers 5A-1, 5A-2 and the gate electrode 4A; however, in this embodiment, the LPCVD (low pressure chemical vapor deposition) method is employed for growing the layers.

Figure 2D:
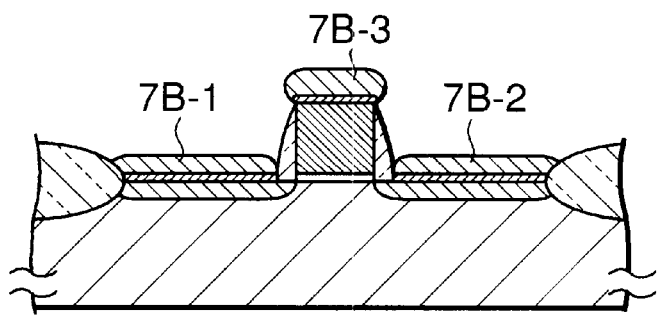

A RT-CVD apparatus is used for growing the layers. The substrate is guided into a growth furnace, and after evacuation, the temperature of the substrate is raised to 750° C. from the room temperature in a hydrogen atmosphere. Next, hydrogen flow of 20 slm is supplied in a vacuum of 1300 Pa; and waiting for the temperature of the substrate and the degree of vacuum being stabilized, $SiH_2Cl_2$ gas of 100 sccm and HCl gas of 100 sccm are supplied as material gases to selectively grow the silicon layers 7B-1, 7B-2, 7B-3 of 30 nm thick, as shown in FIG. 2(d).

Figure 2E:
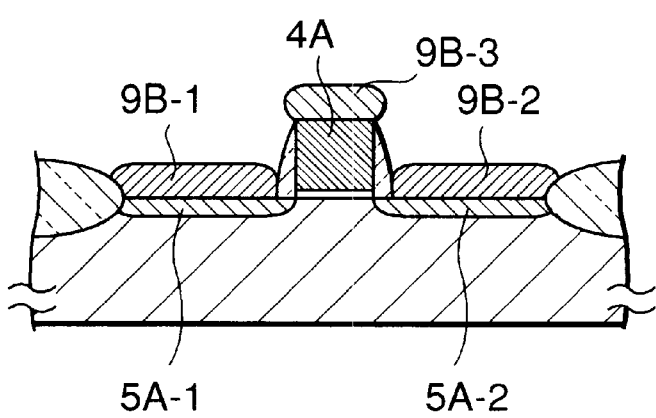
Figure 3A:
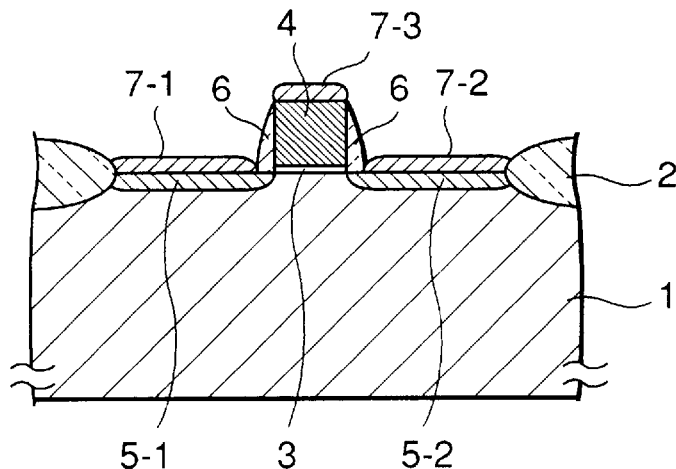
FIGS. 3(A)–3(D) illustrate sectional views for explaining the processes of the conventional method of manufacturing a semiconductor device, being shown in order to be divided into (a) through (d).
Figure 3B:
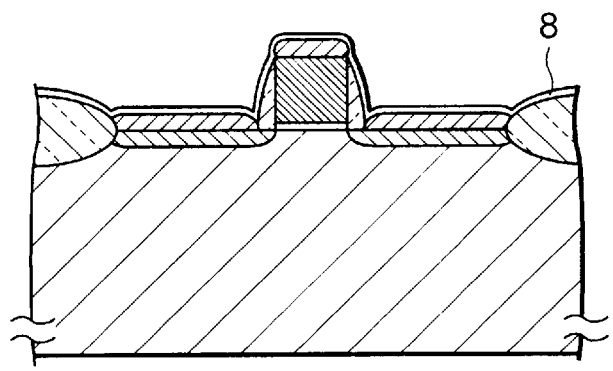
Figure 3C:
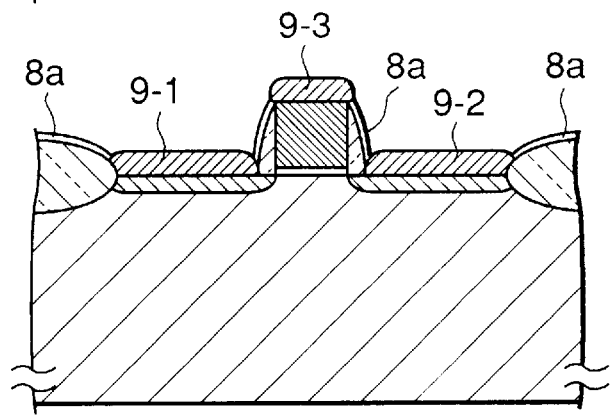
Figure 3D:
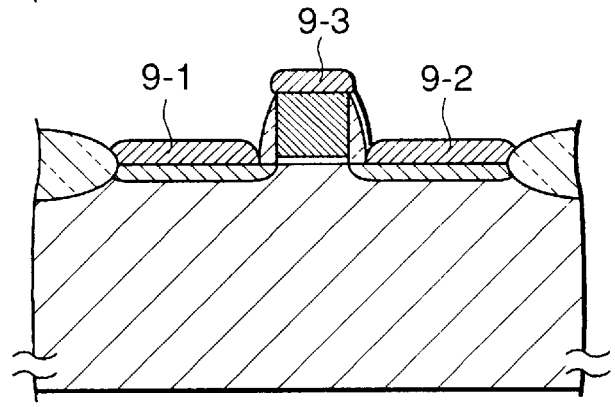

Further, a titanium film of 30 nm thick is grown by the spattering method, and then annealing at 650 ° C. for about 30 seconds is applied to form the film into a silicide. Thereafter, the substrate is treated by the mixed solution of an aqueous ammonia and aqueous hydrogen peroxide, and a titanium film remaining unreacted on the insulating film is removed. Thus, as shown in FIG. 2(e), the titanium silicide layers 9B-1, 9B-2, 9B-3 are formed.

Thereafter, by employing the well-known process, a MOS integrated circuit is manufactured.

Also in this embodiment, the same as in the first embodiment, the redistribution of impurities from the source/drain diffusion layer were not found before and after the process of elevated layer formation.

Employing the foregoing process of the invention, PMOS transistors were manufactured and the depth of junction in the source/drain region was evaluated. The result confirmed that the depth ofjunction of the transistors manufactured through the process of the invention was 80 nm. Compared with 110 nm by the conventional process, there was a significant improvement. Further, the operation was confirmed up to the gate length of 0.2 $\mu$m, as for transistors manufactured by the process of the invention. However, the transistors having the gate length less than 0.25 $\mu$m, made by the conventional process, confirmed that the threshold voltage varied and the transistors did not operate normally.

The foregoing embodiments deal with the PMOS transistor, however naturally, the invention can also be applied to the NMOS transistor and the CMOS semiconductor device. Further, titanium was used as a metal formed after Si being piled up; however, W, Co, Mo and the like can also be used.

As described herein above, according to the method of the invention, a first metal film is formed on a surface of a crystalline silicon to be formed into a first silicide layer, and then a silicon layer is selectively grown on the first silicide layer; thereby, a high temperature heat treatment for removing a native oxide film becomes needless, Thus, the temperature of the process can be lowered, whereby a MOS transistor in which a resistance of the source/drain region is lowered can be produced by laminating a silicide layer or silicon layer on a diffusion layer, which prevents redistribution of impurities from the diffusion layer. In consequence, the method contributes to achieving a MOS integrated circuit having a fine structure of deep submicron level.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device having a process of forming a refractory metal silicide film laminated on a diffusion layer selectively formed on a surface of a silicon substrate, said method comprising the steps of:

forming a first silicide layer by depositing a first metal film on a surface of the diffusion layer and applying a first annealing;

removing the first metal film remaining unreacted by etching;

selectively forming a silicon layer by CVD on the first silicide layer; and forming a second silicide layer by depositing a second metal film to overlay the silicon layer and applying a second annealing.

2. A method of manufacturing a semiconductor device, comprising the steps of:

forming a gate electrode comprising silicon on a gate insulating film formed on a silicon substrate, and selectively forming a diffusion layer on a surface of the silicon substrate, self-aligned with the gate electrode;

exposing a top surface of the gate electrode and a surface of the diffusion layer;

forming a first silicide layer on each of the top surface of the gate electrode and the exposed surface of the diffusion layer by depositing a first metal film on the whole surface, applying a first annealing, and thereafter removing the first metal film remaining unchanged into a silicide film;

selectively forming a silicon layer by CVD on said first siuicide layers; and laminating a second silicide layer on said first silicide layer by depositing a second metal film on said silicon layer, applying a second annealing, and thereafter removing said second metal film remaining unchanged into a silicide film.

3. A method of manufacturing a semiconductor device, as claimed in claim 1, wherein the first metal film is able to getter a native oxide film of silicon.

4. A method of manufacturing a semiconductor device, as claimed in claim 2, wherein the first metal film is able to getter a native oxide film of silicon.

5. A method of manufacturing a semiconductor device, as claimed in claim 1, wherein the first metal film is a titanium film, and the second metal film comprises any one of a titanium film, tungsten film, molybdenum film, or cobalt film.

6. A method of manufacturing a semiconductor device, as claimed in claim 2, wherein the first metal film is a titanium film, and the second metal film comprises any one of a titanium film, tungsten film, molybdenum film, or cobalt film.

7. A method of manufacturing a semiconductor device, as claimed in claim 1, wherein the first metal film is a titanium film having a thickness of 2 to 10 nm.

8. A method of manufacturing a semiconductor device, as claimed in claim 2, wherein the first metal film is a titanium film having a thickness of 2 to 10 nm.

9. A method of manufacturing a semiconductor device, as claimed in claim 1, wherein as said silicon layer, a polysilicon layer is selectively grown by employing a $Si_2H_6$ gas as a raw material gas.

10. A method of manufacturing a semiconductor device, as claimed in claim 2, wherein as said silicon layer, a polysilicon layer is selectively grown by employing a $Si_2H_6$ gas as a raw material gas.

11. A method of manufacturing a semiconductor device, as claimed in claim 3, wherein as said silicon layer, a polysilicon layer is selectively grown by employing a $Si_2H_6$ gas as a raw material gas.

12. A method of manufacturing a semiconductor device, as claimed in claim 1, wherein as said silicon layer, a polysilicon layer is selectively grown by employing a $SiH_2Cl_2$ gas and a HCl gas as a raw material gas.

13. A method of manufacturing a semiconductor device, as claimed in claim 2, wherein as said silicon layer, a polysilicon layer is selectively grown by employing a $SiH_2Cl_2$ gas and a HCl gas as a raw material gas.

14. A method of manufacturing a semiconductor device, as claimed in claim 3, wherein as said silicon layer, a polysilicon layer is selectively grown by employing a $SiH_2Cl_2$ gas and a HCl gas as a raw material gas.

* * * * *

UNITED STATES PATENT AND TRADEMARK OFFICE
CERTIFICATE OF CORRECTION

PATENT NO. : 5,972,785
DATED : October 26, 1999
INVENTOR(S) : Seiichi SHISHIGUCHI et al.

It is certified that error appears in the above-indentified patent and that said Letters Patent is hereby corrected as shown below:

On the title page, insert Item [30] as follows:

--[30]  Foreign Application Priority Data

October 21, 1996   [JP]   Japan........277757/1996--.

Signed and Sealed this

Twenty-third Day of May, 2000

*Attest:*

Q. TODD DICKINSON

*Attesting Officer*   *Director of Patents and Trademarks*